(12) United States Patent
Zhang et al.

(10) Patent No.: US 7,081,414 B2
(45) Date of Patent: Jul. 25, 2006

(54) DEPOSITION-SELECTIVE ETCH-DEPOSITION PROCESS FOR DIELECTRIC FILM GAPFILL

(75) Inventors: Lin Zhang, San Jose, CA (US); Xiaolin Chen, San Jose, CA (US); DongQing Li, Santa Clara, CA (US); Thanh N Pham, San Jose, CA (US); Farhad K Moghadam, Saratoga, CA (US); Zhuang Li, San Jose, CA (US); Padmanabhan Krishnaraj, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 278 days.

(21) Appl. No.: 10/445,240

(22) Filed: May 23, 2003

(65) Prior Publication Data

US 2004/0251236 A1 Dec. 16, 2004

(51) Int. Cl.
H01L 21/302 (2006.01)
(52) U.S. Cl. .............. 438/710; 438/221; 438/706; 438/723
(58) Field of Classification Search .......... 438/219, 438/221, 295, 706, 710, 715, 723
See application file for complete search history.

(56) References Cited

U.S. PATENT DOCUMENTS

| | | |
|---|---|---|
| 4,468,413 A | 8/1984 | Bachmann |
| 4,690,746 A | 9/1987 | McInerney et al. |
| 4,737,379 A | 4/1988 | Hudgens et al. |
| 4,835,005 A | 5/1989 | Hirooka et al. |
| 4,851,370 A | 7/1989 | Doklan et al. |
| 4,872,947 A | 10/1989 | Wang et al. |
| 4,890,575 A | 1/1990 | Ito et al. |
| 4,892,753 A | 1/1990 | Wang et al. |
| 4,894,352 A | 1/1990 | Lane et al. |
| 4,960,488 A | 10/1990 | Law et al. |
| 5,000,113 A | 3/1991 | Wang et al. |
| 5,013,691 A | 5/1991 | Lory et al. |
| 5,089,442 A | 2/1992 | Olmer |
| 5,156,881 A | 10/1992 | Okano et al. |
| 5,215,787 A | 6/1993 | Homma |
| 5,271,972 A | 12/1993 | Kwok et al. |
| 5,275,977 A | 1/1994 | Otsubo et al. |

(Continued)

FOREIGN PATENT DOCUMENTS

GB 2 267 291 A 12/1993

(Continued)

OTHER PUBLICATIONS

U.S. Appl. No. 09/854,083, filed May 11, 2001, Tan et al.

(Continued)

*Primary Examiner*—Lan Vinh
(74) *Attorney, Agent, or Firm*—Townsend and Townsend and Crew LLP (57) ABSTRACT

A deposition/etching/deposition process is provided for filling a gap in a surface of a substrate. A liner is formed over the substrate so that distinctive reaction products are formed when it is exposed to a chemical etchant. The detection of such reaction products thus indicates that the portion of the film deposited during the first etching has been removed to an extent that further exposure to the etchant may remove the liner and expose underlying structures. Accordingly, the etching is stopped upon detection of distinctive reaction products and the next deposition in the deposition/etching/deposition process is begun.

9 Claims, 8 Drawing Sheets

U.S. PATENT DOCUMENTS

| | | | |
|---|---|---|---|
| 5,279,865 A | 1/1994 | Chebi et al. | |
| 5,288,518 A | 2/1994 | Homma | |
| 5,302,233 A | 4/1994 | Kim et al. | |
| 5,314,724 A | 5/1994 | Tsukune et al. | |
| 5,319,247 A | 6/1994 | Matsuura | |
| 5,334,552 A | 8/1994 | Homma | |
| 5,362,526 A | 11/1994 | Wang et al. | |
| 5,385,763 A | 1/1995 | Okano et al. | |
| 5,399,529 A | 3/1995 | Homma | |
| 5,413,967 A | 5/1995 | Matsuda et al. | |
| 5,416,048 A | 5/1995 | Blalock et al. | |
| 5,420,075 A | 5/1995 | Homma et al. | |
| 5,429,995 A | 7/1995 | Nishiyama et al. | |
| 5,468,342 A | 11/1995 | Nulty et al. | |
| 5,474,589 A | 12/1995 | Ohga et al. | |
| 5,563,105 A | 10/1996 | Dobuzinsky et al. | |
| 5,571,576 A | 11/1996 | Qian et al. | |
| 5,599,740 A | 2/1997 | Jang et al. | |
| 5,624,582 A | 4/1997 | Cain | |
| 5,645,645 A | 7/1997 | Zhang et al. | |
| 5,648,175 A | 7/1997 | Russell et al. | |
| 5,661,093 A | 8/1997 | Ravi et al. | |
| 5,679,606 A | 10/1997 | Wang et al. | |
| 5,712,185 A | 1/1998 | Tsai et al. | |
| 5,719,085 A | 2/1998 | Moon et al. | |
| 5,804,259 A | 9/1998 | Robles | |
| 5,850,105 A | 12/1998 | Dawson et al. | |
| 5,858,876 A | 1/1999 | Chew | |
| 5,872,052 A | 2/1999 | Iyer | |
| 5,872,058 A | 2/1999 | Van Cleemput et al. | |
| 5,910,342 A | 6/1999 | Hirooka et al. | |
| 5,913,140 A | 6/1999 | Roche et al. | |
| 5,915,190 A | 6/1999 | Pirkle | |
| 5,937,323 A | 8/1999 | Orczyk et al. | |
| 5,939,831 A | 8/1999 | Fong et al. | |
| 5,944,902 A | 8/1999 | Redeker et al. | |
| 5,953,635 A | 9/1999 | Andideh | |
| 5,968,610 A | 10/1999 | Liu et al. | |
| 5,976,327 A | 11/1999 | Tanaka | |
| 5,990,000 A | 11/1999 | Hong et al. | |
| 5,990,013 A | 11/1999 | Berenguer et al. | |
| 6,013,191 A | 1/2000 | Nasser-Faili et al. | |
| 6,013,584 A | 1/2000 | M'Saad | |
| 6,030,881 A | 2/2000 | Papasouliotis et al. | |
| 6,037,018 A | 3/2000 | Jang et al. | |
| 6,039,851 A | 3/2000 | Iyer | |
| 6,059,643 A | 5/2000 | Hu et al. | |
| 6,114,235 A * | 9/2000 | Foote et al. | 438/636 |
| 6,136,685 A | 10/2000 | Narwankar et al. | |
| 6,167,834 B1 | 1/2001 | Wang et al. | |
| 6,170,428 B1 | 1/2001 | Redeker et al. | |
| 6,182,602 B1 | 2/2001 | Redeker et al. | |
| 6,189,483 B1 | 2/2001 | Ishikawa et al. | |
| 6,190,233 B1 | 2/2001 | Hong et al. | |
| 6,191,026 B1 | 2/2001 | Rana et al. | |
| 6,194,038 B1 | 2/2001 | Rossman | |
| 6,197,705 B1 | 3/2001 | Vassiliev | |
| 6,203,863 B1 | 3/2001 | Liu et al. | |
| 6,217,658 B1 | 4/2001 | Orczyk et al. | |
| 6,228,751 B1 | 5/2001 | Yamazaki et al. | |
| 6,313,010 B1 | 11/2001 | Nag et al. | |
| 6,335,288 B1 | 1/2002 | Kwan et al. | |
| 6,395,150 B1 | 5/2002 | Van Cleemput et al. | |
| 6,503,843 B1 | 1/2003 | Xia et al. | |
| 6,596,654 B1 | 7/2003 | Bayman et al. | |
| 6,835,638 B1 * | 12/2004 | Forbes et al. | 438/590 |
| 6,876,086 B1 * | 4/2005 | Sekine et al. | 257/777 |

FOREIGN PATENT DOCUMENTS

| | | |
|---|---|---|
| JP | 61-276-977 A | 12/1986 |
| JP | 2-58836 A | 2/1990 |
| JP | 4-239750 | 8/1992 |
| JP | 4-341568 | 11/1992 |
| JP | 7-161703 A | 6/1995 |
| WO | WO 92/20833 | 11/1992 |

OTHER PUBLICATIONS

Abraham, "Reactive Facet Tapering of Plasma Oxide For Multilevel Interconnect Applications," VMIC Conference. pp 115-121 (1987).

Chang et al. "Frequency Effects and Properties of Plasma Deposited Fluorinated Silicon Nitride", American Vacuum Society. 1988. pp. 524-532.

Fukada et al. "Preparation of SiOF Films with Low Dielectric Constant By ECR Plasma CVD", Japan. DUMIC Conference. Feb. 1995. pp. 43-49.

Galiano et al. "Stress-Temperature Behavior of Oxide Films Used for Intermetal Dielectric Applications", VMIC Conference. Jun. 1992. pp. 100-106.

Laxman, "Low e Dielectrics: CVD Fluorinated Silicon Dioxides", Semiconductor International. May 1995. pp. 71-74.

Lee et al., "Dielectric Planarization Techniques For Narrow Pitch Multilevel Interconnects," VMIC Conference, pp. 85-92 (1987).

Matsuda et al. "Dual Frequency Plasma CVD Fluorosilicate Glass: Deposition for 0.25 um Interlevel Dielectrics", DUMIC Conference. Feb. 1995. pp. 22-28.

Musaka, "Single Step Gap Filling Technology fo Subhalf Micron Metal Spacings on Plasma Enhanced TEOS/O2 Chemical Vapor Deposition System," International Conference on Solid State Devices and Materials pp. 510-512, held in Japan, (1993).

Nalwa, H.S., *Handbook of Low and High Dielectric Constant Materials and Their Applications*, vol. 1, p. 66 (1999).

Nguyen, s.v., "High-Density Plasma Chemical Vapor Deposition of Silicon-Based Dielectric Films for Integrated Circuits," *Journal of Research and Development*, vol. 43, 1/2 (1999).

Qian et al., "High Density Plasma Deposition aand Deep Submicron Gap Fill with Low Dielectric Constant SiOF Films," DUMIC Conference, pp. 50-56, held in California (1995).

Robles et al. "Effects of RF Frequency and Deposition Rates on the Moisture Resistance of PECVD TEOS-Based Oxide Films", ECS Extended Abstracts. vol. 92-1. May 1992. pp. 215-216.

Shapiro et al. "Dual Frequency Plasma CVD Fluorosilicate Glass: Water Absorption And Stability", DUMIC Conference. Feb. 1995. pp. 118-123.

Usami et al. "Low Dielectric Constant Interlayer Using Fluorine-Doped Silicon Oxide", Jpn. J. Appl. Phys. vol. 33, Jan. 1994. pp. 408-412.

Vassiliev et al., "Trends in Void-Free Pre-Metal CVD Dielectrics," *Solid State Technology*, pp. 129-136 (Mar. 2001).

Yu et al. "Step Coverage Study of Peteos Deposition for Intermetal Dielectric Applications", VMIC Conference. Jun. 1990. pp. 166-172.

* cited by examiner

DEPOSITION-SELECTIVE ETCH-DEPOSITION PROCESS FOR DIELECTRIC FILM GAPFILL

BACKGROUND OF THE INVENTION

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulative material to isolate the elements both physically and electrically. As circuit densities increase, however, the widths of these gaps decrease, increase their aspect ratios and making it progressively more difficult to fill the gaps without leaving voids. The formation of voids when the gap is not filled completely is undesirable because they may adversely affect operation of the completed device, such as by trapping impurities within the insulative material.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

In some instances where gaps have a large aspect ratio and narrow width, gaps have been filled with thermal CVD techniques using a "dep/etch/dep" process by sequentially depositing material, etching some of it back, and depositing additional material. The etching step acts to reshape the partially filled gap, opening it so that more material can be deposited before it closes up and leaves an interior gap. Such dep/etch/dep processes have also been used with PECVD techniques, but some thermal and PECVD techniques are still unable to fill gaps having very large aspect ratios even by cycling deposition and etching steps.

Cycling of deposition and etching steps was traditionally viewed by those of skill in the art as inutile in the context of HDP-CVD processes. This view resulted from the fact that, very much unlike PECVD processes, the high density of ionic species in the plasma during HDP-CVD processes causes there to be sputtering of a film even while it is being deposited. This simultaneous sputtering and deposition of material during a deposition process tends to keep the gap open during deposition, and was therefore believed to render a separate intermediate etching step superfluous. This prevailing view proved to be partially correct in that much higher aspect-ratio gaps could be filled using an HDP-CVD process than could be filled even with a PECVD dep/etch/dep process. Nevertheless, in U.S. Pat. No. 6,194,038, filed Mar. 20, 1998 by Kent Rossman, the unexpected result was demonstrated that gapfill could be improved even further by using a dep/etch/dep process under certain HDP-CVD process conditions. This result was later confirmed in U.S. Pat. No. 6,030,181, filed May 5, 1998 by George D. Papasouliotis et al.

The use of HDP-CVD dep/etch/dep processes has been valuable in permitting gaps with higher aspect ratios to be filled, but limits have remained to the scope of their use. In particular, the use of an etching step presents a possibility of damaging the structures that define the gaps to be filled. This possibility exists when insufficient material is deposited during the first deposition and/or when too much of the deposited material is removed during the etching step. Optimization of a recipe is hindered by the fact that individual chamber characteristics and/or individual wafer characteristics may affect the deposition and etching. As the trend towards more densely packed devices continues, it is desirable to improve HDP-CVD dep/etch/dep processes to accommodate increasing aspect ratios of gaps.

BRIEF SUMMARY OF THE INVENTION

Embodiments of the invention thus provide a dep/etch/dep process for filling a gap in a surface of a substrate. A liner is formed over the substrate so that distinctive reaction products are formed when it is exposed to a chemical etchant. The detection of such reaction products thus indicates that the portion of the film deposited during the first etching has been removed to an extent that further exposure to the etchant may remove the liner and expose the underlying structures. Accordingly, the etching is stopped upon detection of distinctive reaction products and the next deposition in the dep/etch/dep process is begun.

The depositions may be performed using an HDP-CVD process, in which process gases are flowed to the process chamber and a plasma generated from the process gas. To deposit a silicon oxide film, the process gas may comprise a silicon source such as $SiH_4$, an oxygen source such as $O_2$, and a fluent gas such as He. To ensure the distinctiveness of the reaction products between the liner and the etchant gas, their chemical compositions may be chosen so that they do not share a common element. For example, if the liner is a silicon nitride liner, the etchant gas may comprise a gas that does not include silicon or nitrogen, such as $C_xF_y$, or $F_2$. In some instances, the etchant gas may include a mixture of gases, such as a mixture of $C_x$, $F_y$, $O_2$, and He. In such an instance, the characteristic reaction products may include $CN_x$, $NO_x$, and $NF_x$. When the etchant gas comprises a carbon-containing gas such as $C_xF_y$, carbon residue from the etching step may be removed, such as by flowing $O_2$ into the process chamber. If the liner is a silicon carbide liner, the gas may comprise a gas that does not include silicon or carbon, such as $NF_3$ or $F_2$.

In other embodiments, the process may include additional steps to account for specific characteristics of the substrate. For example, an electrical bias may be applied to the substrate during the etching step. The film may be passivated after chemically etching the film and before depositing the remainder of the film. The chemical etching of the film may be part of a multistep etching process that also includes a physical etching of the film.

The methods of the present invention may be embodied in a computer-readable storage medium having a computer-readable program embodied therein for directing operation of a substrate processing system. Such a system may include a process chamber, a substrate holder, a pressure-control system, and a gas-delivery system. The computer-readable program includes instructions for operating the substrate processing system to deposit a film in accordance with the embodiments of the present invention.

A further understanding of the nature and advantages of the present invention may be realized by reference to the remaining portions of the specification and the drawings.

DETAILED DESCRIPTION OF THE INVENTION

1. Introduction

Embodiments of the invention are directed to methods and apparatus for depositing a silicon oxide film to fill a gap in a surface of a substrate with a multistep deposition and etching process. Silicon oxide films deposited according to the techniques of the invention have excellent gap-fill capabilities are able to fill high-aspect-ratio gaps encountered in, for example, shallow-trench-isolation structures. Films deposited by the methods of the invention are suitable for use in the fabrication of a variety of integrated circuits, and are particularly useful in filling gaps in 90-nm technology (0.09 μm) or smaller.

Figure 1A:
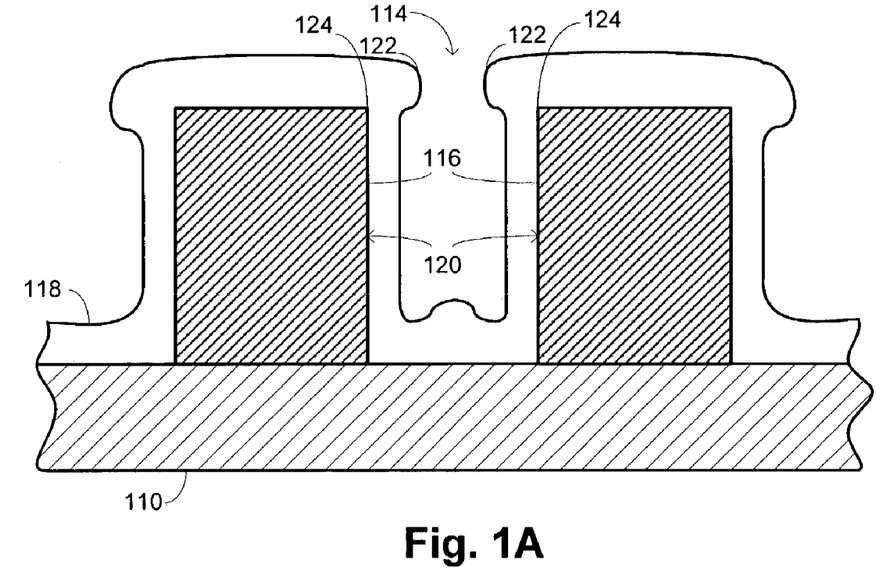
FIGS. 1A and 1B are schematic cross-sectional drawings illustrating the formation of a void during a gapfill process.
Figure 1B:
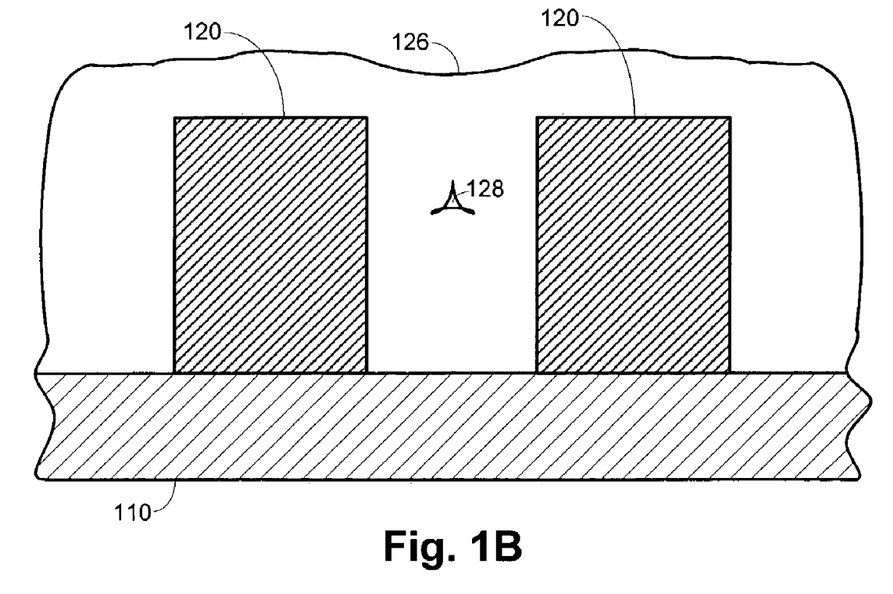

The gapfill problem addressed by embodiments of the invention is illustrated schematically with the cross-sectional views shown in FIGS. 1A and 1B. FIG. 1A shows a vertical cross section of a substrate 110, such as may be provided with a semiconductor wafer, having a layer of features 120. Adjacent features define gaps 114 that are to be filled with dielectric material 118, with the sidewalls 116 of the gaps being defined by the surfaces of the features 120. As the deposition proceeds, dielectric material 118 accumulates on the surfaces of the features 120, as well as on the substrate 110 and forms overhangs 122 at the corners 124 of the features 120. As deposition of the dielectric material 118 continues, the overhangs 122 typically grow faster than the gap 114 in a characteristic breadloafing fashion. Eventually, the overhangs 122 grow together to form the dielectric layer 126 shown in FIG. 1B, preventing deposition into an interior void 128.

2. Dep/Etch/Dep Processes

The deposition processes described herein have improved gapfill capability that avoids the formation of such as interior void. The HDP-CVD deposition processes act by providing a gaseous mixture to a process chamber, such as by using the deposition system described in detail below. A high-density plasma is generated from the gas mixture, with "high density" being characterized by the plasma having an ion density greater than about $10^{11}$ ions/cm$^3$. The relative levels of the combined deposition and sputtering characteristics of the high-density plasma may depend on such factors as the flow rates used to provide the gaseous mixture, the source power levels applied to maintain the plasma, the bias power applied to the substrate, and the like. The combination of such factors may conveniently be quantified with a "deposition/sputter ratio," sometimes denoted D/S to characterize the process:

$$\frac{D}{S} \equiv \frac{\text{(net deposition rate)} + \text{(blanket sputtering rate)}}{\text{(blanket sputtering rate)}}.$$

The deposition/sputter rate increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

Other equivalent measures may be used to quantify the relative deposition and sputtering contributions of the HDP process, as is known to those of skill in the art. A common alternative ratio is the "etching/deposition ratio,"

$$\frac{E}{D} \equiv \frac{\text{(source-only deposition rate)} - \text{(net deposition rate)}}{\text{(source-only deposition rate)}},$$

which increases with increased sputtering and decreases with increased deposition. As used in the definition of E/D, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

The desired D/S ratios for a given step in the HDP-CVD processes are generally achieved by including flows of precursor gases and flows of a fluent gas, which may also act as a sputtering agent. The elements comprised by the precursor gases react to form the film with the desired composition. For example, to deposit a silicon oxide film, the precursor gases may include a silicon-containing gas, such as silane $SiH_4$, and an oxygen-containing gas, such as $O_2$. Dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like. The fluent gas may be provided with a flow of $H_2$ or with a flow of an inert gas, including a flow of He, a flow of Ne, a flow of Ar, or a flow of a heavier inert gas such as Xe. The level of sputtering provided by the different fluent gases is inversely related to their atomic mass (or molecular mass in the case of $H_2$), with $H_2$ producing even less sputtering than He. In some embodiments of the invention discussed in greater detail below, the sputtering agent is provided with a premixture of at least two of these gases.

The first deposition of the dep/etch/dep process not only deposits some material in the gaps but also provides some material over the structures that define the gaps that acts to protect them from damage during the subsequent etching step. Embodiments of the invention use a liner deposited over these, where the liner has a composition that produces characteristic reaction products when exposed to a chemical etchant. These reaction products may then be detected during the etching step, with their detection serving to indicate that the protective material deposited during the first deposition step has been removed at least at some point and that further etching of the liner may cause damage to the structures. Detection of such reaction products thus serves to define a dynamic end-point at which the etching step is stopped, and may vary from chamber to chamber or from wafer to wafer.

To better appreciate and understand the present invention, reference is made to FIG. 2, which is a flow diagram that depicts steps associated with one embodiment, and to FIG. 3, which provides simplified cross-sectional views of a structure at different points during the process described in connection with FIG. 2. The structure is shown as a substrate having trenches etched therein as part of a shallow-trench-isolation structure, but the principles described herein may be applied more generally to any structure that defines gaps to be filled. For example, the techniques of the present invention are also applicable to applications such as intermetal dielectric ("IMD") layers and premetal dielectric ("PMD") layers, among others. Also, while the description focuses in particular on deposition of a silicon oxide layer, the techniques of the present invention are applicable to the deposition of a variety of materials using HDP-CVD techniques. These materials, the use of which is application dependent, include phosphorus silica glass ("PSG"), boron-doped silicate glass ("BSG"), borophosphosilicate glass ("BPSG"), and carbon-doped silica glass (SiOC), among others.

Figure 2:
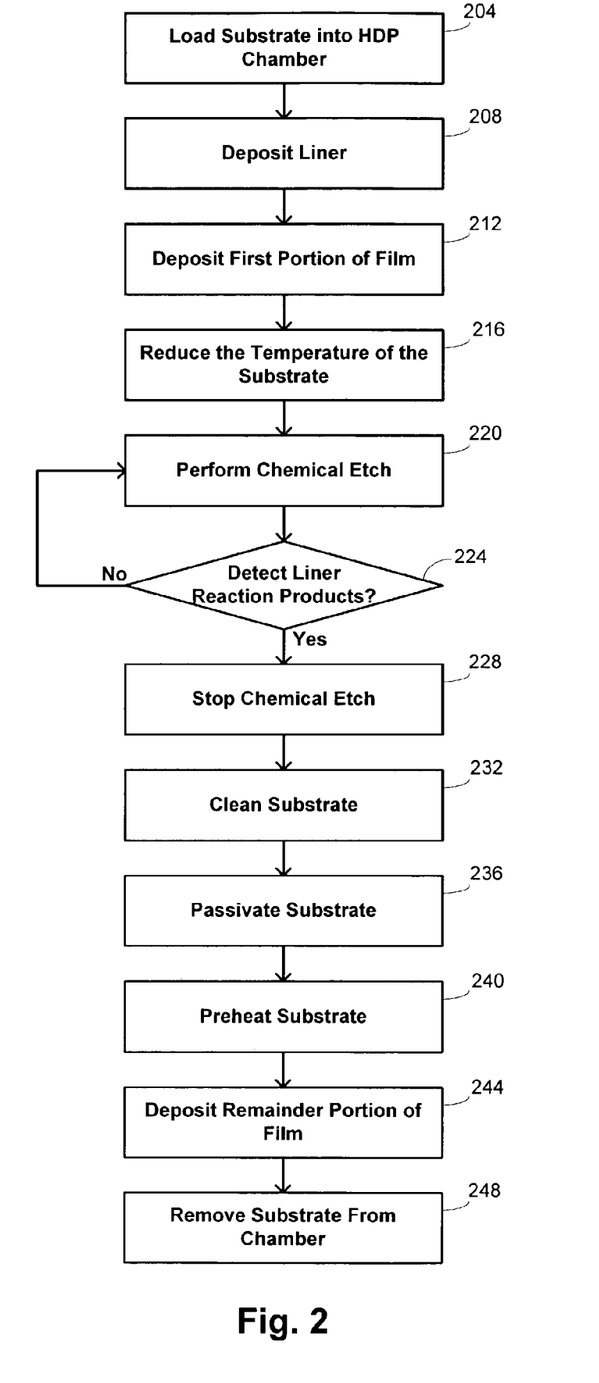
FIG. 2 is a flow diagram illustrating a method for depositing a film to fill a gap in one embodiment of the invention.

As shown in FIG. 2, the process starts by loading a substrate into a substrate-processing chamber at block 204. The substrate has an initial structure 301 shown schematically in FIG. 3 with features 300 that form one or more gaps to be filled with dielectric material. The features 300 may be, for example, areas of a substrate between etched trenches, adjacent metal lines, transistor gates, or other features. Once the substrate is properly positioned, a liner 314 is deposited over the initial structure 301 at block 208 to form structure 302. The liner 314 may be deposited substantially conformally and may be deposited using any suitable deposition technique, including HDP-CVD deposition. In one embodiment, the liner 314 comprises SiN and is deposited by flowing a silicon-containing gas such as $SiH_4$ and a nitrogen-containing gas such as $N_2$ into the process chamber, and generating a plasma. As described further below, the nitrogen in the liner may react chemically with certain etchant gases later in the process to provide a detectable reaction product.

A first portion of the film is deposited at block 212. Such deposition may take place in an embodiment by flowing suitable deposition gases into the chamber and forming a high-density plasma to deposit the film with a process that has simultaneous deposition and sputtering characteristics. In some embodiments of the invention, the D/S ratio is between 4 and 20 to ensure a bottom-up gapfill process that does not clip the corners of the liner 314. For deposition of a silicon oxide film, the deposition gases may include a silicon source such as $SiH_4$ and an oxygen source such as $O_2$, which act as precursor gases for the film, and a fluent gas. In some embodiments, the fluent gas may comprise He, the use of which during such a deposition step is described further in copending, commonly assigned U.S. patent application Ser. No. 10/137,132, entitled "METHOD FOR HIGH ASPECT RATIO HDP CVD GAPFILL," filed Apr. 30, 2002 by Zhong Qiang Hua et al., the entire disclosure of which is herein incorporated by reference for all purposes. Suitable flow rates for the gases for the first deposition are $\mathcal{F}(SiH_4)$= 15–100 sccm, $\mathcal{F}(O_2)$=25–500 sccm, and $\mathcal{F}(He)$=100–400 sccm. This first deposition may be used to deposit between 35 and 85% of the depth of the gap. In addition to depositing material in the gap, material 318 peaks between the gaps to produce a structure like that denoted 303 in FIG. 3.

The first deposition is followed by a chemical etching step at block 220, which may be preceded by a cooling step performed at block 216. By lowering the temperature of the substrate to below about 250° C., better etch control may be achieved during the etching step 220. Such cooling may be performed, for example, by helium backside cooling of the substrate, among other methods, including the use of a separate cooling station.

The chemical etching step at block 220 may be performed in situ or remotely. Characteristic reaction products with the liner are obtained by using an etchant gas whose composition does not share an element with a composition of the liner 314. For example, in embodiments where the liner 314 is a silicon nitride liner, the etchant gas does not include silicon or nitrogen, but may include, for example, a gas that contains fluorine and carbon such as $C_xF_y$, including $CF_4$ and $C_3F_8$, or a gas that contains only fluorine such as $F_2$. The use of $C_xF_y$ may advantageously also form polymer reaction products that protect against an uncontrollable etch, and is generally less expensive than $F_2$. In a specific embodiment, the etching is performed with a gaseous mixture that comprises $C_xF_y$, $O_2$, and an inert gas so that the presence of nitrogen reaction products, including $CN_x$, $NO_x$, and $NF_x$, indicate that etching has proceeded sufficiently to expose the nitride liner. In such an embodiment, suitable flow rates are $\mathcal{F}(C_xF_y)$=50–150 sccm, with $\mathcal{F}(C_xF_y)/\mathcal{F}(O_2)$=1.5–2.5. As indicated in FIG. 2, the method accordingly monitors for the detection of such liner reaction products at block 224.

The chemical etch may be continued as long as no such products are detected, but is stopped at block 228 upon such detection since such detection indicates that the etching has proceeded sufficiently to expose the liner and that further etching may damage the features 300. There are a variety of different techniques that may be used for detection of the reaction products. In one embodiment, optical emission spectroscopy is used by configuring an optical emission spectrometer to detect light from the process chamber through a view port of the process chamber. The spectrometer identifies reaction products by detecting characteristic emission lines.

Figure 3:
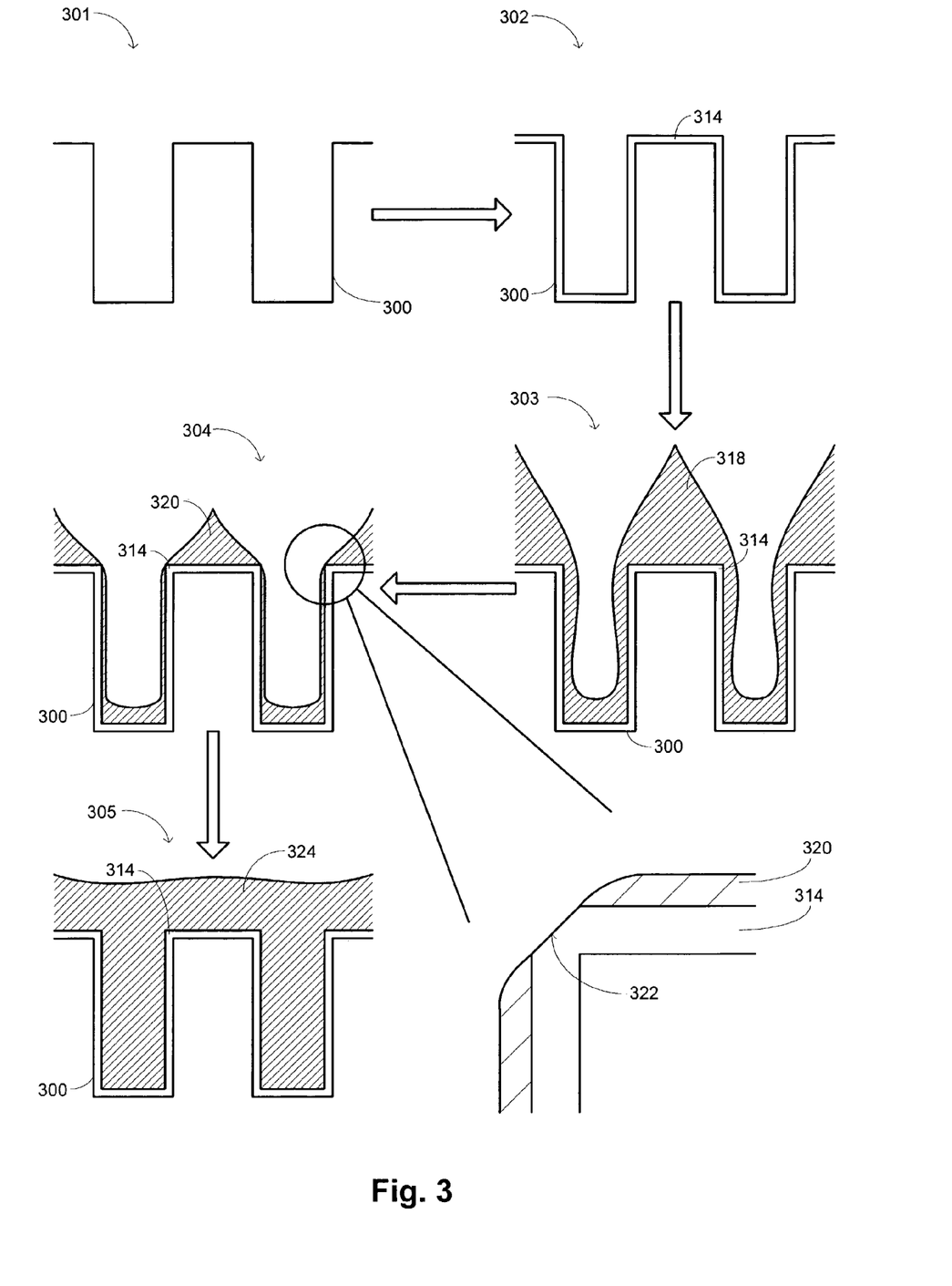
FIG. 3 provides schematic cross-sectional drawings illustrating how a high-aspect-ratio feature may be filled using a dep/etch/dep process according to an embodiment of the invention.

The resulting structure is designated 304 in FIG. 3 and shows not only a reopening of the gaps, but also a reduction in the height of the inter-gap peak. A detailed view of a corner of a feature is shown in the lower right of FIG. 3, illustrating the onset of corner clipping 322 of the liner 314 that prompted the detection of reaction products and stopping the chemical etch at block 228. Such automatic endpoint detection for the etching step is advantageous since it automatically accounts for variations in process variable, including chamber-to-chamber variations, substrate-to-substrate variations, etc. Accounting for such variations in this way thus provides greater uniformity in the results of such process and permits greater optimization of the process. It would be difficult to detect exposure of a nitride liner if a nitrogen-containing etchant gas such as $NF_3$ were used because of the strong nitrogen-related signal produced from the etchant gas itself.

In some embodiments, the etch may be performed anisotropically, such as by applying a bias. This helps to shape the deposited layer 320 so that the basic shape of the original features 300 are retained, but are less severe. Suitable bias power for a 200-mm wafer substrate is about 0–3000 W. Suitable top and side source power is between 1100 and 3000 W.

A summary of flow rates during the etching step is provided in the following table for a 200-mm wafer:

| Parameter | Range | Specific Embodiment |
| --- | --- | --- |
| $F(C_xF_y)$(sccm) | 50–150 | 70 |
| $F(C_xF_y)/F(O_2)$ | 1.5–2.5 | 2.2 |
| $F(He)$(sccm) | 100–500 | 200 |

When the etching gas comprises a carbon-containing gas such as $C_xF_y$, a cleaning step may be included as indicated at block 232. In some embodiments, the cleaning step may be performed with the wafer in the chamber. The cleaning step acts to remove carbon residue left during the $C_xF_y$ etching step from the etched oxide surface and from the walls of the process chamber. Failure to remove carbon residue increases the possibility of incorporating carbon impurities into the silicon oxide film and adversely impacting the performance of final devices. The cleaning mechanism may vary depending on the gas used. For example, a flow of Ar may perform cleaning by using a physical sputtering mechanism. Alternatively, flows of $O_2$ or a combined $O_2$ and Ar flow may be used to combine physical and chemical cleaning mechanisms. In particular, a high-density oxygen plasma treatment cleans the etched oxide surface and the process-chamber walls both physically through a sputtering mechanism and chemically by an intense oxidation reaction between the oxygen and carbon atoms and ions. In instances where the etching gas does not comprise a carbon-containing gas, the cleaning step may be omitted.

In some embodiments, the surface of the etched film may be passivated at block 236 in preparation for the next deposition step. Such passivation removes fluorine that may be incorporated in the film during the chemical etching step 220. In one embodiment, the surface of the film is passivated by exposing the substrate to a passivation gas that is selected to react chemically with the surface of the film to remove any fluorine atoms. Suitable passivating gases include molecular oxygen $O_2$, ozone $O_3$, nitrous oxide $N_2O$, and molecular nitrogen $N_2$ in combination with any of the preceding. Further details of techniques that can be used to passivate the film after an etching step are discussed in copending, commonly assigned U.S. patent application Ser. No. 10/138,189, entitled "HDP-CVD DEP/ETCH/DEP PROCESS FOR IMPROVED DEPOSITION INTO HIGH ASPECT RATIO FEATURES," filed May 3, 2002 by Dongqing Li et al., the entire disclosure of which is herein incorporated by reference for all purposes. In some embodiments, the cleaning and passivation steps 232 and 236 may be performed as a single combined step.

The next deposition step is indicated at block 244 of FIG. 2 and may be preceded by preheating the substrate at block 240. This deposition is used to deposit a remainder portion of the film and to complete deposition of a silicon oxide film may be carried out using a remainder gaseous mixture that comprises a Si-containing gas such as $SiH_4$, an oxygen-containing gas such as $O_2$, and a fluent gas such as He. Suitable D/S ratios for the remainder deposition are in the range between 4 and 20. After the remainder portion of the film has been deposited, the gaps have been filled with material 324 as shown for structure 305 in FIG. 3. The substrate may then be removed from the chamber at block 248.

The increased control over the etching step provided in embodiments of the invention permits accommodation of more aggressive gapfill requirements. As previously noted, embodiments of the invention are particularly useful for the deposition of silicon oxide layers for PMD and STI applications, as each of these applications often involves gapfilling applications with higher aspect ratios than IMD applications. Thus, the deposition process of many embodiments of the invention occurs at a substrate temperature above 450° C. and more typically between 500° C. and 750° C.

Figure 4:
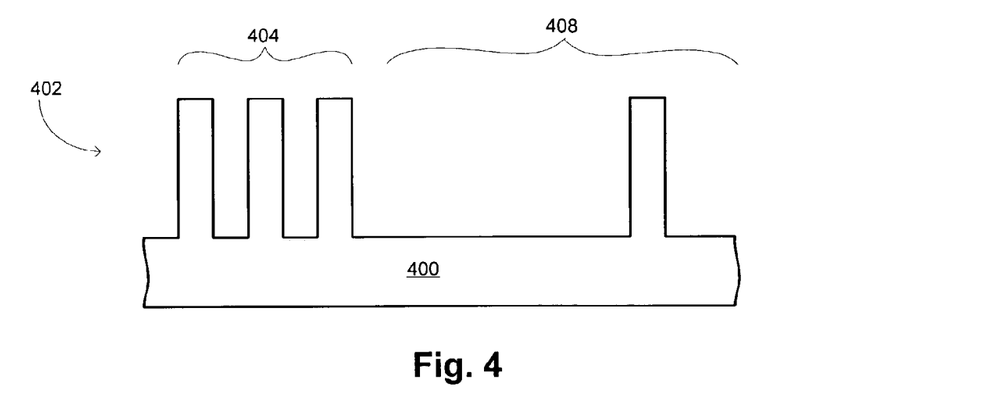
FIG. 4 is a simplified cross-sectional view of a partially completed integrated circuit having trenches to be filled with a dielectric material in both a densely packed area and an open area.
Figure 5:
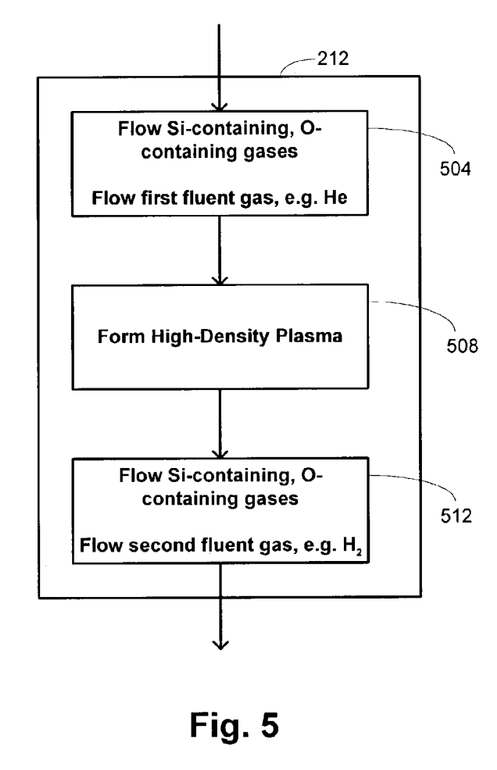
FIG. 5 is a flow diagram illustrating the use of a multistep deposition process for the initial deposition of a dep/etch/dep process.

There are a number of variations that may be adopted for specific deposition applications that are also within the scope of the invention. For example, as shown in FIG. 4, integrated circuits such as integrated circuit 402, typically have areas 404 of densely packed active devices (e.g. where transistors are formed) and relatively isolated (or "open") areas 408 over a substrate 400. Deposition in both areas may be improved with a multistep deposition process. Such a process is illustrated in FIG. 5 by showing the first deposition step 212 as comprising two depositions with different fluent gases. At block 504, Si- and O-containing gases are flowed into the chamber with a first fluent gas, from which a high-density plasma is generated at block 508 to perform a first part of the first deposition. At block 512, Si- and O-containing gases are flowed with a second fluent gas, where the second fluent gas has a lower average molecular weight than the first fluent gas. In a specific embodiment, the first fluent gas comprises an inert gas such as He and the second fluent gas comprises $H_2$.

Figure 6:
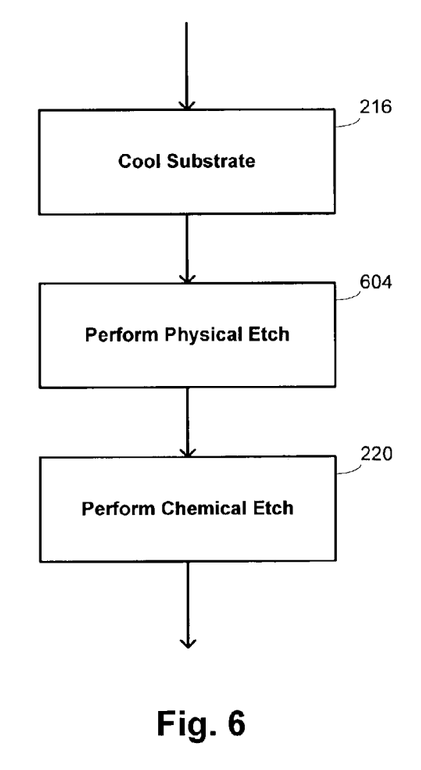
FIG. 6 is a flow diagram illustrating the use of a multistep etching process in some embodiments of the invention.

FIG. 6 illustrates that in some embodiments, the etching step may comprise a multistep etching process that includes a separate physical etch 604 performed before the chemical etch step 220. Further details of such a multistep etch process are described in copending, commonly assigned U.S. patent application Ser. No. 10/279,961, entitled "HIGH DENSITY PLASMA CVD PROCESS FOR GAPFILL INTO HIGH ASPECT RATIO FEATURES," filed Oct. 23, 2002 by Farhan Ahmad et al., the entire disclosure of which is herein incorporated by reference for all purposes.

Furthermore, while the methods have been described above as being performed in situ in a single chamber, they may alternatively be performed in situ in a multichamber system, or may be performed ex situ in different embodiments. Also, while embodiments are described generally in terms of a single dep/etch/dep cycle, more aggressive gapfill may be achieved by using multiple cycles, such as a dep/etch/dep/etch/dep cycle or an even more extended repetition of cycles.

Also, while embodiments of the invention have been illustrated for a silicon nitride liner, other liner compositions may be used in alternative embodiments. For example, in other embodiments, the liner comprises a silicon carbide liner such as BLOK™ (Barrier Low K). BLOK™ is a trademark of Applied Materials, Inc. of Santa Clara, Calif. In such an instance, the etchant gas may comprise a gas that does not contain silicon or carbon, such as $NF_3$ or $F_2$. Stopping the etching in such an embodiment may thus be prompted by the detection of carbon products instead of by the detection of nitrogen products.

3. Exemplary Substrate Processing System

Figure 7A:
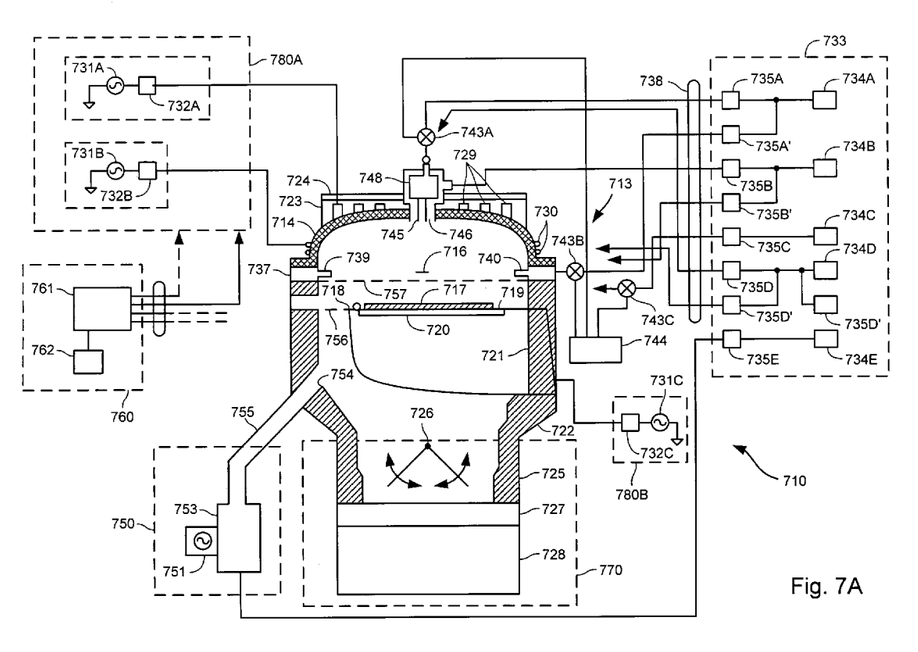
FIG. 7A is a simplified diagram of one embodiment of a high-density-plasma chemical-vapor deposition system according to the present invention.

The methods described above may be implemented with a variety of HDP-CVD systems, some of which are described in detail in connection with FIGS. 7A–7D. FIG. 7A schematically illustrates the structure of such an HDP-CVD system 710 in one embodiment. The system 710 includes a chamber 713, a vacuum system 770, a source plasma system 780A, a bias plasma system 780B, a gas delivery system 733, and a remote plasma cleaning system 750.

The upper portion of chamber 713 includes a dome 714, which is made of a ceramic dielectric material, such as aluminum oxide or aluminum nitride. Dome 714 defines an upper boundary of a plasma processing region 16. Plasma processing region 716 is bounded on the bottom by the upper surface of a substrate 717 and a substrate support member 718.

A heater plate 723 and a cold plate 724 surmount, and are thermally coupled to, dome 714. Heater plate 723 and cold plate 724 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 713 includes a body member 722, which joins the chamber to the vacuum system. A base portion 721 of substrate support member 718 is mounted on, and forms a continuous inner surface with, body member 722. Substrates are transferred into and out of chamber 713 by a robot blade (not shown) through an insertion/removal opening (not shown) in the side of chamber 713. Lift pins (not shown) are raised and then lowered under the control of a motor (also not shown) to move the substrate from the robot blade at an upper loading position 757 to a lower processing position 756 in which the substrate is placed on a substrate receiving portion 719 of substrate support member 718. Substrate receiving portion 719 includes an electrostatic chuck 720 that secures the substrate to substrate support member 718 during substrate processing. In a preferred embodiment, substrate support member 718 is made from an aluminum oxide or aluminum ceramic material.

Vacuum system 770 includes throttle body 725, which houses twin-blade throttle valve 726 and is attached to gate valve 727 and turbo-molecular pump 728. It should be noted that throttle body 625 offers minimum obstruction to gas flow, and allows symmetric pumping. Gate valve 727 can isolate pump 728 from throttle body 725, and can also control chamber pressure by restricting the exhaust flow capacity when throttle valve 726 is fully open. The arrangement of the throttle valve, gate valve, and turbo-molecular pump allow accurate and stable control of chamber pressures from between about 1 millitorr to about 2 torr.

The source plasma system 780A includes a top coil 729 and side coil 730, mounted on dome 714. A symmetrical ground shield (not shown) reduces electrical coupling between the coils. Top coil 729 is powered by top source RF (SRF) generator 731A, whereas side coil 730 is powered by side SRF generator 731B, allowing independent power levels and frequencies of operation for each coil. This dual coil system allows control of the radial ion density in chamber 713, thereby improving plasma uniformity. Side coil 730 and top coil 729 are typically inductively driven, which does not require a complimentary electrode. In a specific embodiment, the top source RF generator 731A provides up to 2,500 watts of RF power at nominally 2 MHz and the side source RF generator 731B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 780B includes a bias RF ("BRF") generator 731C and a bias matching network 732C. The bias plasma system 780B capacitively couples substrate portion 717 to body member 722, which act as complimentary electrodes. The bias plasma system 780B serves to enhance the transport of plasma species (e.g., ions) created by the source plasma system 780A to the surface of the substrate. In a specific embodiment, bias RF generator provides up to 5,000 watts of RF power at 13.56 MHz.

RF generators 731A and 731B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 732A and 732B match the output impedance of generators 731A and 731B with their respective coils 729 and 730. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 7B:
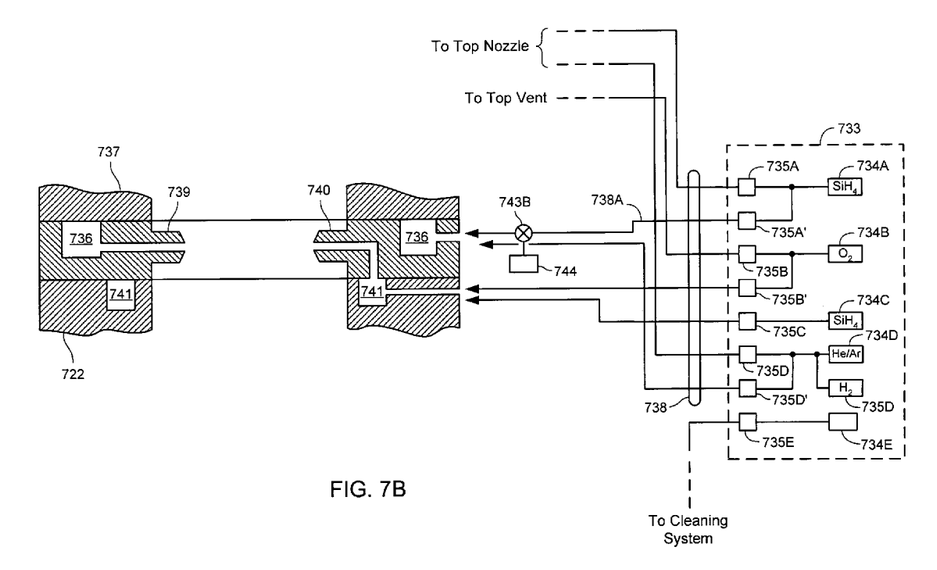
FIG. 7B is a simplified cross section of a gas ring that may be used in conjunction with the exemplary CVD processing chamber of FIG. 7A.

A gas delivery system 733 provides gases from several sources, 734A–734E chamber for processing the substrate via gas delivery lines 738 (only some of which are shown). As would be understood by a person of skill in the art, the actual sources used for sources 734A–734E and the actual connection of delivery lines 738 to chamber 713 varies depending on the deposition and cleaning processes executed within chamber 713. Gases are introduced into chamber 713 through a gas ring 737 and/or a top nozzle 745. FIG. 7B is a simplified, partial cross-sectional view of chamber 713 showing additional details of gas ring 737.

In one embodiment, first and second gas sources, 734A and 734B, and first and second gas flow controllers, 735A' and 735B', provide gas to ring plenum 736 in gas ring 737 via gas delivery lines 738 (only some of which are shown). Gas ring 737 has a plurality of source gas nozzles 739 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 737 has 12 source gas nozzles made from an aluminum oxide ceramic.

Gas ring 737 also has a plurality of oxidizer gas nozzles 740 (only one of which is shown), which in a preferred embodiment are co-planar with and shorter than source gas nozzles 739, and in one embodiment receive gas from body plenum 741. In some embodiments it is desirable not to mix source gases and oxidizer gases before injecting the gases into chamber 713. In other embodiments, oxidizer gas and source gas may be mixed prior to injecting the gases into chamber 713 by providing apertures not shown) between body plenum 741 and gas ring plenum 736. In one embodiment, third, fourth, and fifth gas sources, 734C, 734D, and 734D', and third and fourth gas flow controllers, 735C and 735D', provide gas to body plenum via gas delivery lines 738. Additional valves, such as 743B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 743B, to isolate chamber 713 from delivery line 738A and to vent delivery line 738A to vacuum foreline 744, for example. As shown in FIG. 7A, other similar valves, such as 743A and 743C, may be incorporated on other gas delivery lines. Such three-way valves may be placed as close to chamber 713 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 7A, chamber 713 also has top nozzle 745 and top vent 746. Top nozzle 745 and top vent 746 allow independent control of top and side flows of the gases, which improves film uniformity and allows fine adjustment of the film's deposition and doping parameters. Top vent 746 is an annular opening around top nozzle 745.

In one embodiment, first gas source 734A supplies source gas nozzles 739 and top nozzle 745. Source nozzle MFC 735A' controls the amount of gas delivered to source gas nozzles 739 and top nozzle MFC 735A controls the amount of gas delivered to top gas nozzle 745. Similarly, two MFCs 735B and 735B' may be used to control the flow of oxygen to both top vent 746 and oxidizer gas nozzles 740 from a single source of oxygen, such as source 734B. The gases supplied to top nozzle 745 and top vent 746 may be kept separate prior to flowing the gases into chamber 713, or the gases may be mixed in top plenum 748 before they flow into chamber 713. Separate sources of the same gas may be used to supply various portions of the chamber.

A remote microwave-generated plasma cleaning system 750 is provided to periodically clean deposition residues from chamber components. The cleaning system includes a remote microwave generator 751 that creates a plasma from a cleaning gas source 734E (e.g., molecular fluorine, nitrogen trifluoride, other fluorocarbons or equivalents) in reactor cavity 753. The reactive species resulting from this plasma are conveyed to chamber 713 through cleaning gas feed port 754 via applicator tube 755. The materials used to contain the cleaning plasma (e.g., cavity 753 and applicator tube 755) must be resistant to attack by the plasma. The distance between reactor cavity 753 and feed port 754 should be kept as short as practical, since the concentration of desirable plasma species may decline with distance from reactor cavity 753. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 720, do not need to be covered with a dummy wafer or otherwise protected, as may be required with an in situ plasma cleaning process. In one embodiment, this cleaning system is used to dissociate atoms of the etchant gas remotely, which are then supplied to the process chamber 713. In another embodiment, the etchant gas is provided directly to the process chamber 713. In still a further embodiment, multiple process chambers are used, with deposition and etching steps being performed in separate chambers.

System controller 760 controls the operation of system 710. In a preferred embodiment, controller 760 includes a memory 762, such as a hard disk drive, a floppy disk drive (not shown), and a card rack (not shown) coupled to a processor 761. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 731 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 765, and a light pen 766, as depicted in FIG. 7C.

Figure 7C:
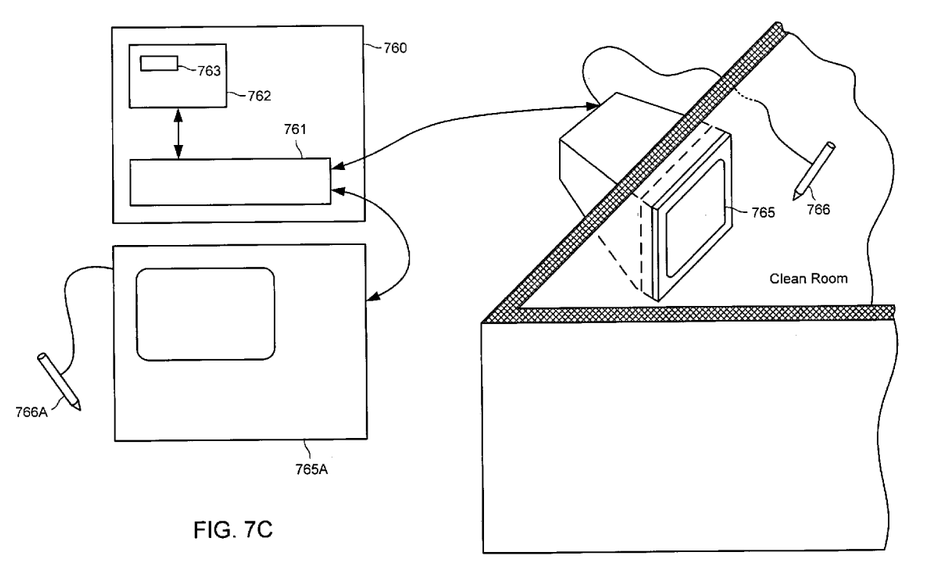
FIG. 7C is a simplified diagram of a monitor and light pen that may be used in conjunction with the exemplary CVD processing chamber of FIG. 7A.

FIG. 7C is an illustration of a portion of an exemplary system user interface used in conjunction with the exemplary CVD processing chamber of FIG. 7A. System controller 760 includes a processor 761 coupled to a computer-readable memory 762. Preferably, memory 762 may be a hard disk drive, but memory 762 may be other kinds of memory, such as ROM, PROM, and others.

System controller 760 operates under the control of a computer program 763 stored in a computer-readable format within memory 762. The computer program dictates the timing, temperatures, gas flows, RF power levels and other parameters of a particular process. The interface between a user and the system controller is via a CRT monitor 765 and a light pen 766, as depicted in FIG. 7C. In a preferred embodiment, two monitors, 765 and 765A, and two light pens, 766 and 766A, are used, one mounted in the clean room wall (665) for the operators and the other behind the wall (665A) for the service technicians. Both monitors simultaneously display the same information, but only one light pen (e.g. 766) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 7D:
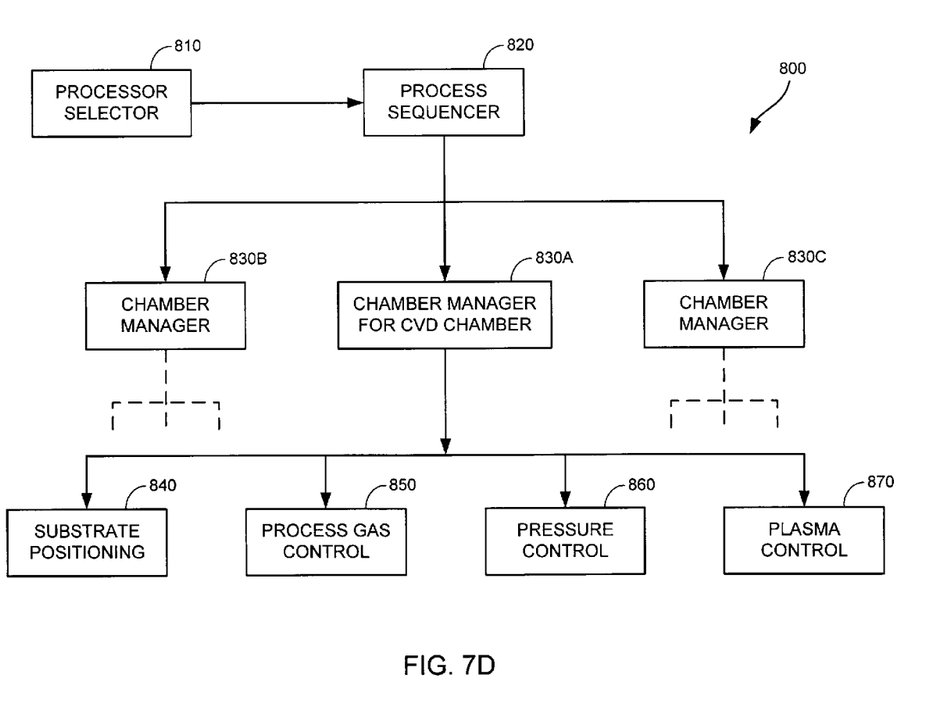
FIG. 7D is a flow chart of an exemplary process control computer program product used to control the exemplary CVD processing chamber of FIG. 7A.

FIG. 7D shows an illustrative block diagram of the hierarchical control structure of computer program 800. A user enters a process set number and process chamber number into a process selector subroutine 810 in response to menus or screens displayed on the CRT monitor by using the light pen interface. The process sets are predetermined sets of process parameters necessary to carry out specified processes, and are identified by predefined set numbers. Process selector subroutine 810 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 760, and the signals for controlling the process are output on the analog and digital output boards of system controller 760.

A process sequencer subroutine 820 comprises program code for accepting the identified process chamber and set of process parameters from the process selector subroutine 810 and for controlling operation of the various process chambers. Multiple users can enter process set numbers and process chamber numbers, or a single user can enter multiple process set numbers and process chamber numbers; sequencer subroutine 820 schedules the selected processes in the desired sequence. Preferably, sequencer subroutine 820 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 820 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 820 determines which process chamber and process set combination is going to be executed next, sequencer subroutine 820 initiates execution of the process set by passing the particular process set parameters to a chamber manager subroutine 830A–830C, which controls multiple processing tasks in chamber 713 and possibly other chambers (not shown) according to the process set sent by sequencer subroutine 820.

Examples of chamber component subroutines are substrate positioning subroutine 840, process gas control subroutine 850, pressure control subroutine 860, and plasma control subroutine 870. Those having ordinary skill in the art will recognize that other chamber control subroutines can be included depending on what processes are selected to be performed in chamber 713. In operation, chamber manager subroutine 830A selectively schedules or calls the process component subroutines in accordance with the particular process set being executed. Chamber manager subroutine 830A schedules process component subroutines in the same manner that sequencer subroutine 820 schedules the process chamber and process set to execute. Typically, chamber manager subroutine 830A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 7A and 7D. Substrate positioning subroutine 840 comprises program code for controlling chamber components that are used to load a substrate onto substrate support number 718. Substrate positioning subroutine 840 may also control transfer of a substrate into chamber 713 from, e.g., a plasma-enhanced CVD ("PECVD") reactor or other reactor in the multi-chamber system, after other processing has been completed.

Process gas control subroutine 850 has program code for controlling process gas composition and flow rates. Subroutine 850 controls the open/close position of the safety shut-off valves and also ramps up/ramps down the mass flow controllers to obtain the desired gas flow rates. All chamber component subroutines, including process gas control subroutine 850, are invoked by chamber manager subroutine 830A. Subroutine 850 receives process parameters from chamber manager subroutine 830A related to the desired gas flow rates.

Typically, process gas control subroutine 850 opens the gas supply lines, and repeatedly (i) reads the necessary mass flow controllers, (ii) compares the readings to the desired flow rates received from chamber manager subroutine 830A, and (iii) adjusts the flow rates of the gas supply lines as necessary. Furthermore, process gas control subroutine 850 may include steps for monitoring the gas flow rates for unsafe rates and for activating the safety shut-off valves when an unsafe condition is detected.

In some processes, an inert gas, such as argon, is flowed into chamber 713 to stabilize the pressure in the chamber before reactive process gases are introduced. For these processes, the process gas control subroutine 850 is programmed to include steps for flowing the inert gas into chamber 713 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 850 may include steps for bubbling a delivery gas such as helium through the liquid precursor in a bubbler assembly or for introducing the helium to a liquid injection valve. For this type of process, the process gas control subroutine 850 regulates the flow of the delivery gas, the pressure in the bubbler, and the bubbler temperature to obtain the desired process gas flow rates. As discussed above, the desired process gas flow rates are transferred to process gas control subroutine 850 as process parameters.

Furthermore, the process gas control subroutine 850 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 850 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 760 includes program code for controlling the pressure in chamber 713 by regulating the size of the opening of throttle valve 726 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 726 to a fixed position. Setting throttle valve 726 to a fixed position may eventually result in a steady-state pressure.

Alternatively, the chamber pressure may be measured, with a manometer for example, and the position of throttle valve 726 may be adjusted according to pressure control subroutine 860, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 860 is invoked, the desired, or target, pressure level is received as a parameter from chamber manager subroutine 830A. Pressure control subroutine 860 measures the pressure in chamber 713 by reading one or more conventional pressure manometers connected to the chamber; compares the measured value(s) to the target pressure; obtains proportional, integral, and differential (PID) values from a stored pressure table corresponding to the target pressure, and adjusts throttle valve 726 according to the PID values obtained from the pressure table. Alternatively, pressure control subroutine 860 may open or close throttle valve 726 to a particular opening size to regulate the pressure in chamber 713 to a desired pressure or pressure range.

Plasma control subroutine 870 comprises program code for controlling the frequency and power output setting of RF generators 731A and 731B and for tuning matching networks 732A and 732B. Plasma control subroutine 870, like the previously described chamber component subroutines, is invoked by chamber manager subroutine 830A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

Those of ordinary skill in the art will realize that processing parameters can vary for different processing chambers and different processing conditions, and that different precursors can be used without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method for depositing a silicon oxide film to fill a gap in a surface of a substrate disposed in a substrate processing chamber, the method comprising:
   forming a silicon nitride liner over the surface;
   flowing a first process gas comprising a first silicon source, a first oxygen source, and a first fluent gas into the substrate processing chamber;
   forming a plasma having an ion density of at least $10^{11}$ ions/cm$^3$ from the process gas to deposit a first portion of the silicon oxide film over the substrate;
   flowing an etchant gas that does not include nitrogen into the substrate processing chamber to chemically etch the film;
   stopping flowing the etchant gas in response to detection of reaction products that include nitrogen; and thereafter, flowing a second process gas comprising a second silicon source, a second oxygen source, and second fluent gas into the processing chamber to deposit a remainder of the film.

2. The method recited in claim 1 wherein the second fluent gas has a lower average molecular weight that the first fluent gas.

3. The method recited in claim 1 wherein the first and second fluent gases comprise He.

4. The method recited in claim 1 wherein the first and second silicon sources comprise $SiH_4$.

5. The method recited in claim 1 wherein the first and second oxygen sources comprise $O_2$.

6. The method recited in claim 1 wherein the silicon nitride liner is formed substantially conformally over the surface.

7. The method recited in claim 1 wherein the etchant gas comprises $C_xF_y$.

8. The method recited in claim 7 wherein the etchant gas further comprises $O_2$.

9. The method recited in claim 7 further comprising flowing $O_2$ into the process chamber to remove carbon residue after stopping flowing the etchant gas.

* * * * *